United States Patent [19]

Boskamp et al.

[11] Patent Number: 5,030,915
[45] Date of Patent: Jul. 9, 1991

[54] QUADRATURE SURFACE COIL CONSTRUCTION FOR MAGNETIC RESONANCE IMAGING APPARATUS

[75] Inventors: Eddy B. Boskamp, Monroe; Ching T. Lee, Hamden, both of Conn.

[73] Assignee: U.S. Philips Corporation, New York, N.Y.

[21] Appl. No.: 483,187

[22] Filed: Feb. 20, 1990

[51] Int. Cl.$^5$ ............................................. G01R 33/20
[52] U.S. Cl. .................................................... 324/318
[58] Field of Search ............... 324/307, 309, 318, 322; 128/653 SC

[56] References Cited

U.S. PATENT DOCUMENTS

| 4,734,648 | 3/1988 | Machida et al. | 324/322 |
| 4,766,383 | 8/1988 | Fox et al. | 324/322 |
| 4,928,064 | 5/1990 | Keren | 324/318 |

Primary Examiner—Michael J. Tokar
Attorney, Agent, or Firm—William Squire

[57] ABSTRACT

A magnetic resonance imaging detection coil includes an outer coil divided into two symmetrical coils by a transverse central conductor. A 180° phase shift network is coupled across the junction of the central transverse conductor with the outer conductor for providing the central conductor with a virtual ground potential when a magnetic field normal to the general plane of the coil system is present. The two coils formed by the central conductor and the outer conductor form parallel coils functioning similarly as a butterfly coil. The currents in the central conductor are cumulative, flowing in the same direction. The parallel coil system induces current on the central conductor which is 90° out of phase with the current induced in the outer conductor. The signals corresponding to the parallel coil and series coil arrangement are then phase shift combined to place these signals in phase.

19 Claims, 3 Drawing Sheets

QUADRATURE SURFACE COIL CONSTRUCTION FOR MAGNETIC RESONANCE IMAGING APPARATUS

BACKGROUND OF THE INVENTION

This invention relates to a quadrature surface coil system for detecting magnetic fields induced in a body being examined in a magnetic resonant imaging system.

Quadrature surface coil systems for use in magnetic resonance imaging apparatuses are known. For example, reference is made to U.S. Pat. No. 4,816,765, incorporated by reference herein which discloses a quadrature coil system which is used in a magnetic resonance imaging apparatus. The detection coil is one referred to as a surface coil in that it is placed adjacent a surface of a body being examined by the magnetic resonance imaging system apparatus. As disclosed in the aforementioned patent, the detection coil comprises a stack of two coils with locally mutually perpendicular related B fields. A first coil is formed as a butterfly coil having a B field extending parallel to the plane of the coil and the second coil is formed of a single flat coil having a B field extending transversely the plane of the coil. The coils are arranged in a fixed mutual orientation so that for each of the coils reciprocally applied fluxes are compensated for.

The present invention is an improvement of that quadrature coil system. Such quadrature coil systems as disclosed in the aforementioned U.S. patent have the disadvantage in that the coils must be typically arranged planar. The reason for the planar arrangement is that should the coils be bent or otherwise contoured, typically to the shape of the surface to be examined, for example, the spinal column of a human being in the neck-head area, bending of the coil causes the butterfly and single flat coil to be misaligned. The resulting signals become distorted and do not reproduced faithfully the desired magnetic fields produced by the body under examination. The flat coils while satisfactory for some applications where the body under examination is planar and therefore equidistant from the stacked coils, in other instances, is not as satisfactory when the body under examination is curved and non-planar. As a result, the magnetic fields induced by the body and to be detected by the quadrature coil system are spaced different distances from different portions of the coil causing distortions in the signal.

The present inventors recognize a need for a detection quadrature surface detection coil for use with a non-planar body under examination and which overcomes the drawbacks of the stack coil system described above. One problem with producing a coil system for a curved body is that any bends in the coils out of the planar region tend to distort the coil and make the coil non-symmetrical. Further, it is extremely difficult to axially align the magnetic field responsive region of the butterfly coil to the single flat coil once the coils are bent. If the bends are slightly off center, i.e., non-symmetrical, then the two different coil systems, the flat coil and the butterfly coil, tend to respond in a manner producing a distorted unsatisfactory signal. To manufacture bent coils which are exactly physically aligned to respond to aligned magnetic fields is not generally practical. To obtain an optimum signal, the stack of coils should be contoured to the object being examined aligned, and matched.

In a magnetic resonance imaging examination system an apparatus according to the present invention comprises a surface coil magnetic field gradient detection construction comprising an outer conductor forming a first coil and a transverse inner conductor connected at its ends to the outer conductor at spaced points along the outer conductor for dividing the outer conductor into mirror image second coils. The construction includes means for tuning the first and second coils to a given radio frequency such that the first and second coils generate corresponding first and second signals manifesting orthogonal magnetic fields in the body under examination.

A feature of the invention includes signal isolation means coupled to the first and second coils for isolating the first and second signals. By way of example, such isolation means may include 180° phase shift means coupled to the outer conductor at the junction with one end of the transverse inner conductor. This phase shift means places the transverse inner conductor at virtual ground so that the outer conductor corresponds to a single turn coil while the inner conductor with the outer conductor forms a pair of coils corresponding to a butterfly coil, both coils being aligned regardless their bent state because they comprise a common coil structure.

IN THE DRAWING

Figure 1:
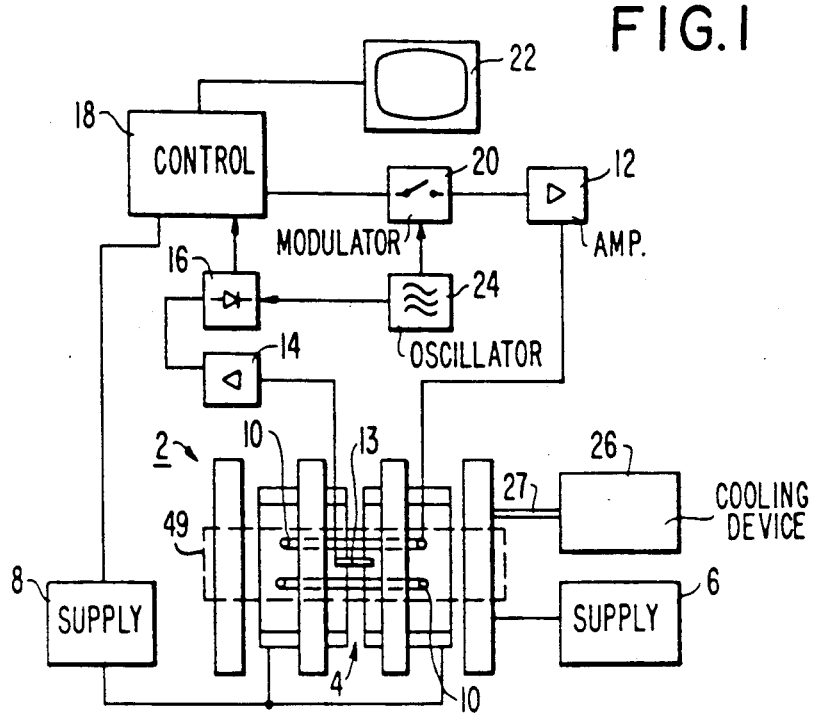
FIG. 1 is a schematic diagram of a magnetic resonance imaging apparatus including a coil system in accordance with one embodiment of the present invention.

A magnetic resonance imaging apparatus as shown in FIG. 1 comprises a magnet system 2 for generating a steady, uniform magnetic field, a magnet system 4 for generating magnetic gradient fields, and power supply sources 6 and 8 for the magnet system 2 and the magnet system 4, respectively. A transmit rf coil 10 generates a radio frequency (rf) magnetic alternating field and is connected to an amplifier 12 for an rf source. A surface coil system 13 detects magnetic resonance signals generated in an object to be examined by an rf transmission field. For reading purposes, the system 13 is connected to a signal amplifier 14. The signal amplifier 14 is connected to a phase-sensitive rectifier 16 which is connected to a central control 18. The central control 18 controls a modulator 20 which applies the modulated signal to amplifier 12, the supply source 8 for the gradient coils, and a monitor 22 for display. An rf oscillator 24 controls the modulator 20 as well as the phase-sensitive rectifier 16 which processes the measurement signals. Cooling can be provided by a cooling device 26 comprising cooling ducts 27. A cooling device of this kind may be constructed as a water cooling system for resistance coils or as a liquid helium drawer system for superconducting coils. The transmitter coil 10, arranged within the magnet systems 2 and 4, encloses a measurement space 28 which offers sufficient room so as to accommodate patients in medical diagnostic apparatus. A steady magnetic field, gradient fields for position selection of slices to be imaged, and a spatially uniform rf alternating field are generated in the measurement space 28. The measurement space 28 is shielded against interference fields by a Faraday cag 29.

Detection coil systems composed of surface coils are not normally used as transmitter coils for generating magnetic resonance signals. The detection and transmitting functions used for other types of coils is less suitable for these coils, although such dual use of surface coils is not precluded for specific meaasurements in practice.

Figure 2:
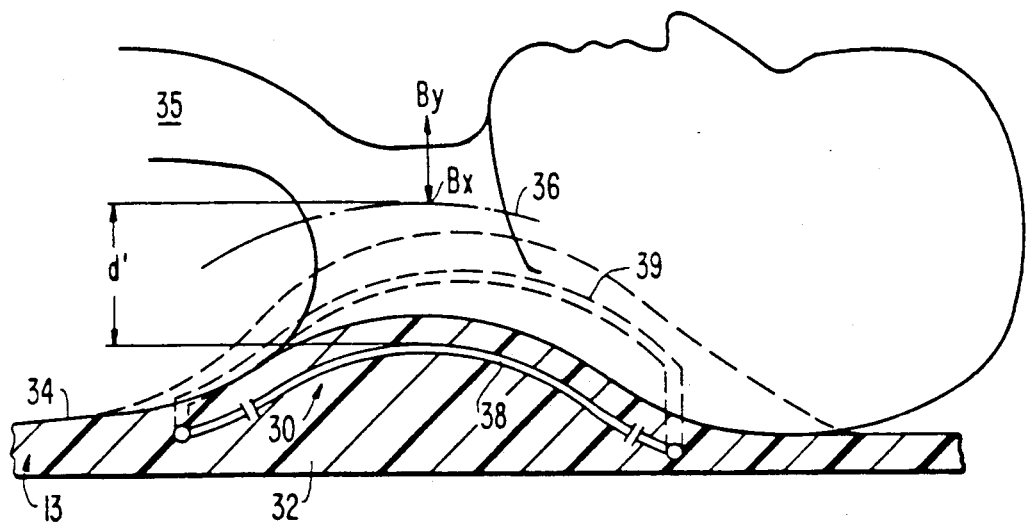
FIG. 2 is a fragmented sectional side elevational view of a quadrature surface coil detection construction in accordance with one embodiment of the present invention in use for examining the spinal cord in the neck region of a person.
Figure 3:
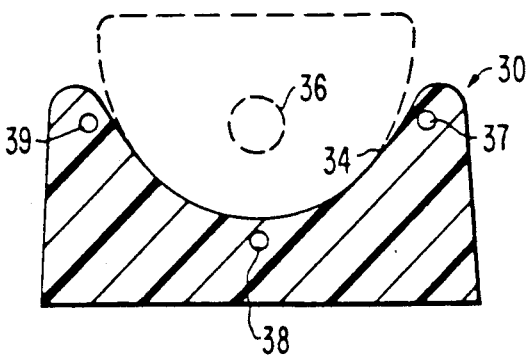
FIG. 3 is a sectional elevation view transverse to the view of FIG. 2 through the neck region of a person.

In FIG. 2, surface coil system 13 comprises a quadrature coil arrangement 30 encased in a magnetic field transparent support 32. The support 32, for example, may be molded thermoplastic or thermoset foam material and the like. The coil system 13 may be placed in grooves in the support. The support 32 has a contoured surface 34. Surface 34 is contoured in complex curves so as to accommodate the neck region, for example, of a patient 35. The patient 35 has a spinal column 36 which is approximately parallel with the curvature of surface 34. The coil arrangement 30 is also curved so as to be approximately equally spaced from the spinal column 36. In FIG. 3, the coil arrangement 30 includes conductors 37, 38 and 39 which are approximately equidistant from the spinal column 36. By arranging the coil arrangement 30 conductors 37, 38 and 39, and other conductors, not shown in FIGS. 2 and 3, substantially equidistant from the spinal column 36 magnetic fields of substantially uniform intensity are sensed by the coil arrangement 30. That is, the column 36 is at the magnetic isocenter of arrangement. However, the complex curved arrangement of the curved configuration of the coil arrangement 30 would not be possible for an optimum response detection signal in prior art surface coils, due to the misalignment of the different stacked coils of such prior art systems.

The reason that the coil arrangement 30 of the present invention does not have the misalignment problem of the prior art coil system is that the coils forming the so-called butterfly arrangement and the single coil arrangement are formed by the same coil conductors. The conductors mechanically forming the coils are the same but are electrically coupled so as to sense orthogonal magnetic fields. The coils sense orthogonal $B_x$ and $B_y$ fields independently of each other and create currents induced by those magnetic fields 90° out of phase with respect to each other in a common coil structure.

Figure 4:
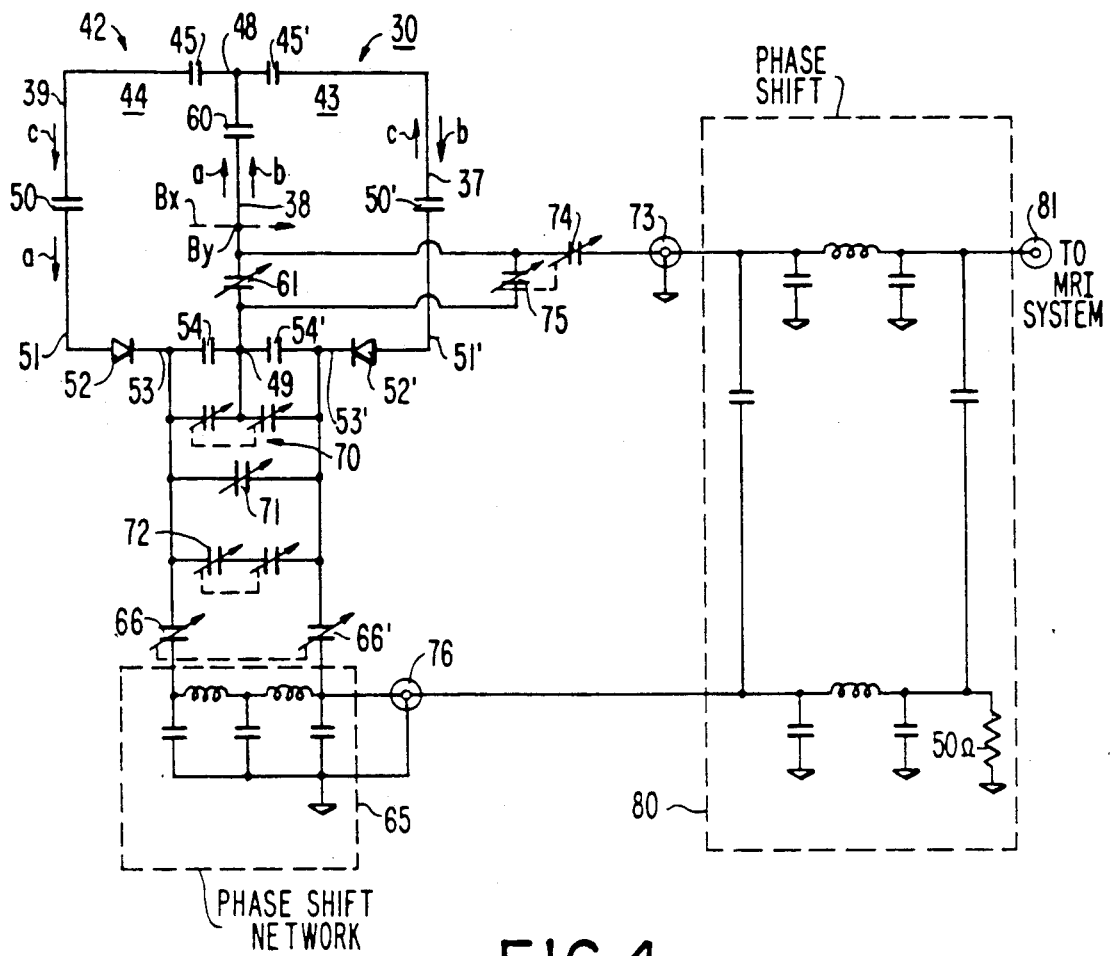
FIG. 4 is a schematic diagram of a quadrature surface coil circuit system used with the embodiment of FIGS. 2 and 3.

In FIG. 4, coil arrangement 30 comprises an outer series coil 42 and two parallel inner coils 43 and 44. The series coil 42 comprises a conductor 37 coupled to conductor 39 through two capacitors 45' and 45 and intermediate conductor 48. Conductor 39 is coupled to junction 49 via capacitor 50, conductor 51, pin diode 52, conductor 53 and capacitor 54. Conductor 37 is coupled to junction 49 via capacitor 50', conductor 51', pin diode 52' and conductor 53'. The primed and unprimed numbers correspond to identical components. The anode of diode 52 is connected to conductor 51 and the anode of diode 52' is connected to conductor 51'. The conductors 37, 48, 39, 51, 53, and the intervening capacitors and pin diodes form the outer series coil 42. The capacitors tune the series coil 42 to a given radio frequency of the system of FIG. 1. Junction 49 is coupled to conductor 48 by a transverse coupling network comprising conductor 38, fixed capacitor 60 and adjustable capacitor 61. Capacitor 60 is essentially the same in value as capacitors 50 and 50'. The capacitor 61 tunes the radio frequency resonance of coils 43 and 44 to the same resonance frequency of coil 42. Conductor 38 and capacitors 60 and 61 divide coil 42 into the two matched coils 43 and 44. Coils 43 and 44 are mirror images of one another.

The coils 43 and 44 are in parallel and act similarly as a butterfly coil such as disclosed, for example, in the aforementioned U.S. Pat. No. 4,816,765. The series coil 42 functions similarly as the single flat coil 32 disclosed in the aforementioned patent. A phase shift network 65 is coupled to conductors 53 and 53' via adjustable respective impedance matching capacitors 66 and 66'. Network 65 provides a 180° phase shift of the signal on conductor 53 as compared to the signal on conductor 53'. Because capacitors 54 and 54' are matched, the junction 49 is at virtual ground to those signals on conductors 53 and 53' produced by the coil 42 in response to a given magnetic field orientation. The current in coil 42 is indicated by arrows c. Because the current flowing in directions of arrows c is shifted 180° by phase shift network 65, the relative potential produced by that current at junction 49 and conductor 48 remains at virtual ground. Because the currents at junction 49 and conductor 48 are at virtual ground no current flows for that induced signal through conductor 38 and capacitors 60 and 61.

However, to ensure that the potentials at junction 49 and conductor 48 are at virtual ground, it is important that the coils 43 and 44 are symmetrical with respect to the sensed magnetic fields. The coils 43 and 44 are in parallel such that the coil 44 when exposed to a magnetic field orthogonal to the magnetic field to which the coil 42 is responsive exhibits a current in the direction of arrows a. Coil 43 exhibits a current flowing in direction of the arrows b in the presence of that same orthogonal magnetic field. As a result, the two currents, a and b flow in the same direction through common conductor 38 of coils 43 and 44. As observed by the arrows b and c at conductors 37 and 39, respectively, those currents flow in opposite directions in coil 42. The diodes 52 and 52' serve as rf switches in a known way.

It is important that the currents induced in coils 43 and 44 be as close as possible in value. To achieve that end, the coils 43 and 44 need to be as symmetrical as possible and need to have a resonance frequency that is as closely matched as possible. For this purpose, a pair of ganged coupled capacitors 70 are connected with their junction connected to junction 49 and their extreme terminals connected to conductors 53 and 53'. The ganged capacitors serve to match the resonance frequency of the coils 43 and 44 and, in effect, provide signal isolation of the current induced in coil 42 from the currents induced in coils 43 and 44 by the sensed respective orthogonal magnetic fields. The ganged capacitors 70 preferably may be a differential capacitor coupled to junction 49 and conductors 53 and 53'. By tuning each of the coils 43 and 44 to the same rf frequency the current at junction 49 and conductor 48 in combination with the phase shift network 65 is as close to virtual ground as possible.

Tuning capacitor 71 tunes the coil 42 to the desired resonance frequency. Ganged series connected capacitors 72 and capacitors 66 and 60' provide impedance matching between the phase shift network 65 and coils 42, 43 and 44. The capacitors 66 and 66' as well as the ganged capacitor 62 are adjustable. A radio frequency connector 73 has its center conductor connected to conductor 38 through variable impedance matching capacitor 74 and to junction 49 through variable impedance matching capacitor 75. Capacitors 74 and 75 are ganged. The phase shift network 65 is connected to rf connector 76.

The two parallel mode coils 43 and 44 respond to a parallel mode flux field $B_x$. The series coil 42 responds to a magnetic field $B_y$ orthogonal to field $B_x$. The currents induced by the parallel mode field $B_x$ in directions of arrows a and b are 90° out of phase with the current induced by the orthogonal field $B_y$ which current flows in the direction of arrows c. Ideally, when the $B_y$ flux is present, no current flows between junction 49 and conductor 48. At this time, no current appears at the rf connector 73. However, during this period, a current appears at rf connector 76 representing the current in the series coil 42. A current that flows on conductor 38 in response to the presence of the $B_x$ flux is 90° out of phase with this current. This current appears at rf connector 73. Connectors 73 and 76 are coupled to a 90° phase shift network 80. Network 80 combines the out of phase signals appearing at connectors 73 and 76 and places those currents in phase at rf connector 81. The connector 81 is coupled to a magnetic resonance imaging system which displays an image corresponding to the signals appearing at connector 81.

Figure 5:
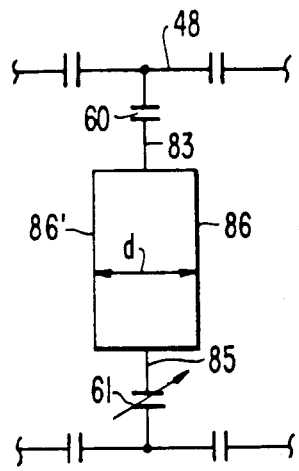
FIG. 5, is a schematic diagram of a portion of the coil construction of FIG. 4 illustrating an alternate embodiment for the center conductor of the detection coil construction.

In FIG. 5, an alternate embodiment is illustrated for conductor 38. Conductors 83 and 85 are coupled via a pair of parallel conductors 86 and 86'. Conductor 83 is connected to capacitor 60 and conductor 85 is connected to capacitor 61. The parallel conductors 86 and 86' are identical in length and are spaced apart a distance d symmetrical relative to a line through conductors 83 and 85. The further apart that the conductors 86 and 86' are spaced, i.e., as d increases, the closer the parallel mode flux $B_x$, FIG. 4, will be sensed relative to the physical position of conductors 86, 86'. That is, in FIG. 2, the distance d' becomes smaller as distance d, FIG. 5, increases. Therefore, depending on the distance d' for a given patient, a surface coil system 13 can be provided which is closely matched to the patient's configuration. The closer the distance between the spinal column 36 and the coil arrangement 30, the more sensitive the system to the magnetic flux $B_x$ of the coil arrangement and the more optimum the induced currents in the coils 43 and 44.

Figures 7A, 7B, 7C:
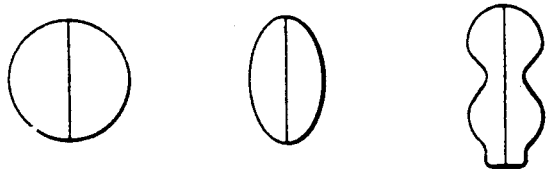
FIGS. 7a, 7b and 7c are diagrams illustrating generally the configuration of alternate coil geometries employed with the embodiments of FIGS. 4 and FIG. 6.

As indicated, it is important that the coils 43 and 44 be matched. This implies that these coils are identically mirror image symmetrical arrangements. The rectangular arrangement of FIG. 4 is only by way of example. In FIGS. 7a, 7b and 7c the two coils may have any arrangement wherein the outer conductor may be circular, elliptical or odd shaped as shown in the figures. The important thing is that both coils 43 and 44 are mirror images of each other and can be tuned to the same frequency.

Figure 6:
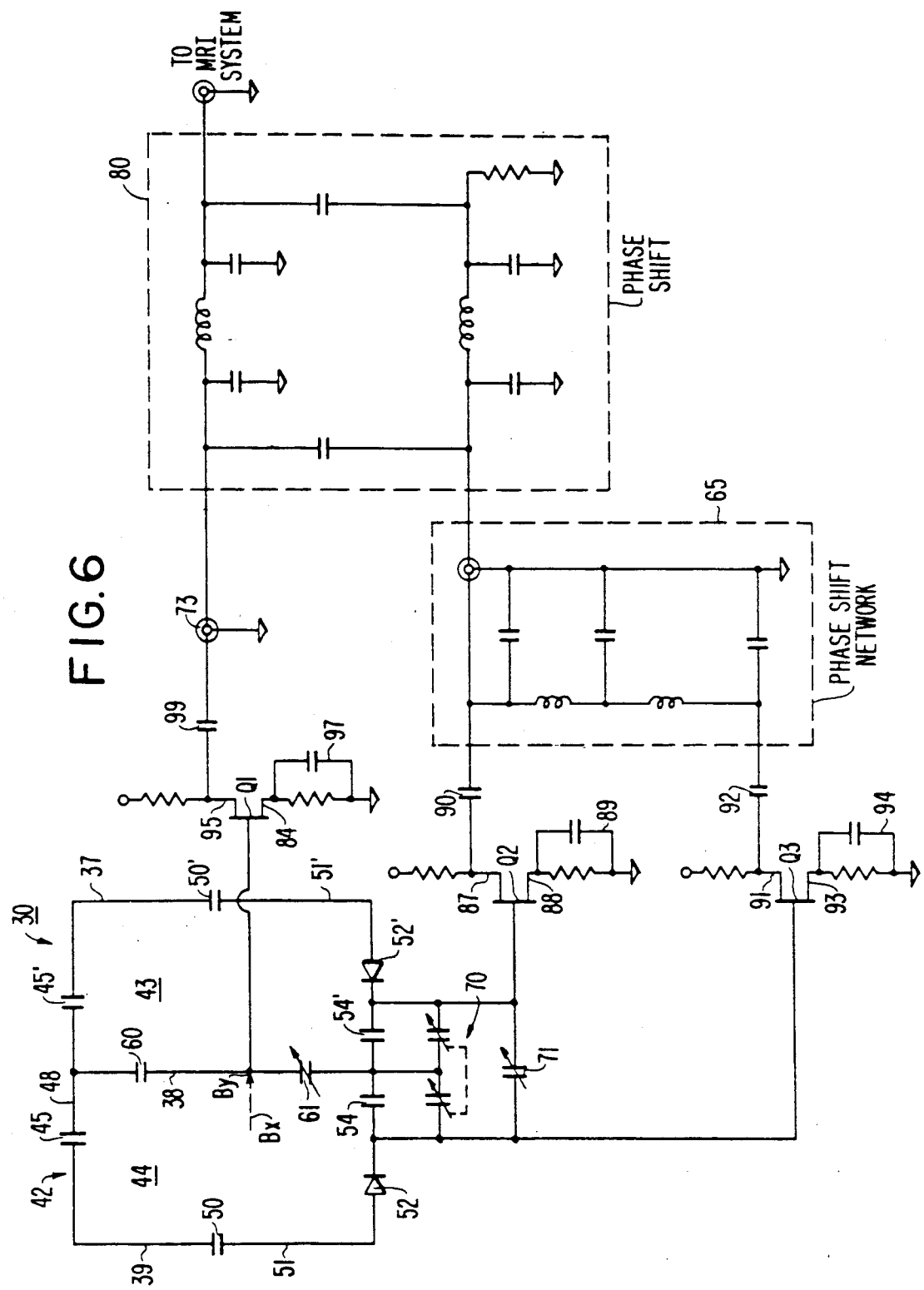
FIG. 6 is a schematic diagram of a circuit employed with a coil system quadrature coil construction in accordance with a second embodiment of the present invention.

In FIG. 6, parts identical to FIG. 4 have the same reference numerals. In FIG. 6, a first impedance matching field effect transistor Q1 is coupled with its gate connected to conductor 38, its drain 83 coupled through a resistance to a voltage source and its source 84 coupled to ground through a biasing network 85. The source 83 is coupled to rf connector 73 via a DC blocking capacitor 86. The junctions between the cathode of diode 52' and capacitor 54' is coupled to one of ganged capacitors 70 and to the gate of field effect transistor Q2 on one side of capacitor 71. The cathode of diode 52 is connected to the other of ganged capacitors 70, to the other side of adjustable capacitor 71 and to the gate of field effect transistor Q3. The source 86 of transistor Q2 is coupled to a positive voltage through a resistor network and the drain 88 is connected to ground via a biasing network 89. The source 87 is also coupled through a DC blocking capacitor 90 to one side of phase shift network 65, which it will be recalled, provides 180° phase shift.

The source 91 of field effect transistor Q3 is coupled to a positive voltage source via a resistor and to the phase shift network 65 through a DC blocking capacitor 92. The drain 93 is coupled to ground through a bias network 94. The source 91 is coupled to phase shift network 65 through a DC blocking capacitor 92. Thus, the signals appearing across capacitors 90 and 92 represents the series signal produced by coil 42. The capacitors 70 adjusts the orthogonality of coils 43 and 44, i.e., make mirror image of one another, as discussed above. Capacitor 71 also performs similarly as described above in connection with the embodiment of FIG. 4. The transistors Q1, Q2 and Q3 provide high impedance isolation between the phase shift networks 65 and 80 to the coil system. The transistors Q1, Q2 and Q3 replace the impedance matching networks of the embodiment of FIG. 4.

The conductors 37, 38, 39 and so on are all made preferably of identical conductive tubing of the same inductance. Of course, the conductors may have other configurations in accordance with a given implementation. The parallel mode flux $B_x$ induces a current in each of the coils 43 and 44 and this current is sensed by transistor Q1 and applied to the phase shift network 80 via rf connector 73. The orthogonal flux $B_y$ is sensed by the series coil 42 and is applied to the phase shift network 80 via the phase shift network 65 and transistors Q2 and Q3. Transistors Q2 and Q3 and their biasing networks 89 and 94, respectively, are matched so as to provide a signal at junction 49 for the coil 42 current that is at virtual ground potential.

As a result, a single coil system comprising an outer conductor and a transverse inner conductor connected to the single outer conductor may be bent to any desired non-planar configuration that is relatively symmetrical relative to the central conductor 38 to conform to a given curved configuration. The capacitors 61, 70 and 71 adjust the resonance of the separate coils so as to match and adapt for the non-symmetry that may be caused by the actual mechanical bending of the coils to the particular non-planar configuration. The capacitor 61 which may be buried within the support 32, FIG. 2, may be made accessible by an aperture (not shown) in the support 32. Regardless the bend configuration of the coils, misalignment of the butterfly coil, i.e., the two parallel coils, to the series coil, e.g., coil 42, is not a problem because these coils comprise the same conductors. It is a simple matter to tune the different coils via the associated tuning coils to the desired frequency. It should be understood that the term conductor as employed in the claims includes reactive components such as capacitors and inductors.

WHAT IS CLAIMED IS:

1. A radio frequency quadrature surface coil construction responsive to magnetic gradient fields generated by a magnetic resonance examination system, said construction comprising:

a tuned coil arrangement comprising an annular outer conductor and an inner conductor having first and second ends connected to the outer conductor at respective spaced points along the outer conductor forming with the outer conductor a pair of tuned coils, said pair of coils being responsive to a magnetic field having a given flux direction for generating a first radio frequency current of a first value in each of the coils, the current in each coil flowing in opposite directions in the outer conductor and in the same direction in said inner conductor;

said outer conductor forming a tuned coil responsive to a magnetic field having a given flux direction orthogonal to the given flux direction for generating a second radio frequency current of a second value in that coil, said second current flowing in said outer conductor in a given direction;

means for substantially preventing said second current from flowing in said inner conductor; and output means for outputting first and second signals respectively manifesting the values of said first and second currents.

2. The construction of claim 1 wherein said means for preventing includes phase shift means coupled to the outer conductor for placing said inner conductor at virtual ground relative to the potential corresponding to said second current.

3. The construction of claim 1 wherein said pair of coils are mirror images of one another.

4. The construction of claim 2 wherein said phase shift means includes 180° phase shift means coupled to said outer conductor on opposite sides of the connection of the inner conductor to the outer conductor at one of said points.

5. The construction of claim 1 wherein said pair of coils have the same inductance and lie in a curved plane symmetrical relative to said inner conductor.

6. The construction of claim 5 further including a support structure for supporting an object to be examined and means for fixedly securing the coil to said support structure.

7. The construction of claim 6 further including adjustable tuning means coupled to said pair of coils and tuned coil for fine tuning each said coils to a given radio frequency.

8. The construction of claim 1 wherein said pair of coils lie in a curved plane whose locus of points is symmetrical relative to a reference plane passing through said inner conductor.

9. The construction of claim 1 wherein said inner conductor includes a pair of spaced parallel conductors, one end of said parallel conductors being connected to one of said points and the other end of said parallel conductors being connected to the other of said points.

10. The construction of claim 1 wherein said first and second signals are 90° out of phase, said construction including phase shift means for placing said first and second signals in phase.

11. A radio frequency quadrature surface coil construction responsive to magnetic gradient fields generated by a magnetic resonance examination system, said construction comprising:

a pair of symmetrical annular surface coils having a common conductor and second conductors connected to the common conductor, said second conductors forming a third coil, said pair of coils being responsive to one of said fields having a given vector for generating a first current in each said coils, said first currents flowing in the same direction in said common conductor and in opposite directions in said second conductors;

said third coil being responsive to a magnetic field having a vector orthogonal to said given vector, said orthogonal field generating a second current in said third coil, said second current being 90° out of phase with the first currents;

means coupled to said third coil for precluding said second current from flowing in said common conductor;

means for generating first and second signals respectively manifesting said first and second currents; and combining means coupled to said signal generating means for placing said first and second signals in phase.

12. The construction of claim 11 wherein said means for precluding includes phase shift means coupled to said coils for placing said common conductor at a reference potential relative to the potentials corresponding to said second current.

13. The construction of claim 11 wherein said means for precluding including 180° phase shift means coupled to said outer conductor across one of the connections of said common conductor to said outer conductor.

14. The construction of claim 13 further including first output means connected to said common conductor for outputting a first signal manifesting the value of said first current, second output means connected to said phase shift means for outputting a second signal manifesting the value of said second current and 90° phase shift means connected to said first and second output means for placing said first and second signals in phase.

15. The construction of claim 14 wherein said coils include adjustable tuning means for tuning all said coils to resonate at a given radio frequency.

16. The construction of claim 11 wherein said pair of coils define a a non-planar symmetrical shape.

17. A radio frequency quadrature surface coil construction responsive to magnetic gradient fields generated by a magnetic resonance examination system, said construction comprising:

a body of radio frequency transparent material contoured to receive a mating object to be examined;

a pair of tuned coils each including capacitor means for establishing an approximate resonant frequency of each coil, said coils having at least one common conductor and respective non-common conductors forming an annular coil divided by said common conductor;

tuning means coupled to said common conductor and to said non-common conductors for matching the resonant frequency of said pair of coils and for tuning all said coils to a desired resonant frequency;

180° phase shift means coupled to said non-common conductors across one junction of said common conductor therewith;

first output means coupled to said phase shift means for producing a first signal manifesting a current induced by a first magnetic field; and second output means coupled to said common conductor for producing a second signal manifesting the value of a current induced by a second magnetic field orthogonal to the first field.

18. The construction of claim 17 wherein said first and second signals are 90° out of phase, said first output means includes first field effect transistor means between said phase shift means and said non-common conductors, said second output means including second field effect transistor means coupled to said common conductor, and 90° phase shift means coupled to said first and second field effect transistor means for placing said first and second signals in phase.

19. In a magnetic resonance imaging examination system, an apparatus comprising:

means for inducing orthogonal magnetic field gradients in a body under examination; and a surface coil magnetic field gradient detection construction comprising an outer conductor forming a first coil and at least one transverse inner conductor connected at its ends to the outer conductor at spaced points along the outer conductor for dividing the outer conductor into two mirror image second coils, said construction including means for tuning said first and second coils to a given radio frequency and means for causing said first and second coils to operate in quadrature and generate corresponding first and second relatively isolated signals manifesting said orthogonal magnetic fields in said body.

* * * * *